United States Patent [19]

Tustaniwskyj et al.

[11] Patent Number: 5,048,599
[45] Date of Patent: Sep. 17, 1991

[54] LEAK TOLERANT LIQUID COOLING SYSTEM EMPLOYING AN IMPROVED AIR PURGING MECHANISM

[75] Inventors: Jerry T. Tustaniwskyj, Mission Viejo, Calif.; Johan P. Bakker, Union Lake, Mich.

[73] Assignee: Unisys Corporation, Blue Bell, Pa.

[21] Appl. No.: 596,108

[22] Filed: Oct. 11, 1990

[51] Int. Cl.$^5$ .................. F28D 15/00; H01L 23/473
[52] U.S. Cl. ..................... 165/104.32; 165/104.33; 165/917; 361/385
[58] Field of Search ............. 165/104.32, 104.33, 165/917; 361/385

[56] References Cited

U.S. PATENT DOCUMENTS

| | | | |
|---|---|---|---|
| 3,989,102 | 11/1976 | Jaster et al. | 165/104.32 |
| 4,698,728 | 10/1987 | Tustaniwskyj et al. | 361/385 |
| 4,967,832 | 11/1990 | Porter | 165/104.32 |

Primary Examiner—Albert W. Davis, Jr.
Attorney, Agent, or Firm—Charles J. Fassbender; Mark T. Starr

[57] ABSTRACT

A leak tolerant liquid cooling system for electrical components comprises a cooling circuit which contains a pump and conduits that circulate a liquid coolant past the electrical components and through the bottom chamber of a purge tank. This purge tank also has a top chamber which is connected to the bottom chamber through a passageway; and, the bottom chamber is sized such that the liquid coolant passes through it with a velocity which is low enough to let any air bubbles in the coolant rise and move by buoyancy through the passageway into the top chamber. Air is purged from the top chamber through a valved output port by forcing liquid coolant into the top chamber through a valved input port. To complete this purge quickly, the passageway between the purge tank chambers is configured in a way which hinders the flow of coolant from the top chamber to the bottom chamber while the coolant is being forced into the top chamber. As the air purging occurs, the coolant continues to be pumped past the electrical components through the cooling circuit.

13 Claims, 4 Drawing Sheets

LEAK TOLERANT LIQUID COOLING SYSTEM EMPLOYING AN IMPROVED AIR PURGING MECHANISM

BACKGROUND OF THE INVENTION

This invention relates to leak tolerant liquid cooling systems for electrical components.

In the prior art, one such liquid cooling system is described in U.S. Pat. No. 4,698,728 which is assigned to the present assignee. There, a liquid coolant is directed past the electrical components via certain conduits at sub-atmospheric pressure. Since the pressure of the liquid inside of the conduits is less than the pressure of the atmosphere outside the conduits, air gets sucked into the conduits if they develop a leak. Consequently, none of the liquid coolant is spilled.

However, after the air gets into the conduits, it must somehow be purged from them. Otherwise, if the air is allowed to remain entrained in the coolant, the rate at which the coolant moves through the system would be reduced which in turn would reduce the systems cooling ability. Also, the air could get trapped in certain critical passages of the cooling system, such as passages in a cooling jacket around the electrical components, which in turn would cause hot spots in the cooling system.

In the above referenced patent '728, the preferred mechanism by which air is removed from the coolant is illustrated and described in conjunction with FIGS. 2a-2d. However, with that mechanism, a pump which circulates the liquid coolant through the conduits must be temporarily turned off and then turned back on in order to perform the air purging operation.

Such an interruption in the operation of the pump is undesirable because it temporarily lowers the rate at which the coolant flows through the system, and that in turn lowers the rate at which the electrical components are cooled. In addition, switching the pump from off to on produces pressure surges throughout the cooling circuit, and that in turn stresses the cooling circuit components and their joints. Further, switching the pump from off to on produces a step like increase in electrical power which is drawn from the cooling system's power supply; and thus the power supply must include compensation to insure that harmful transients do not occur in any supply voltages to the electrical components that are being cooled.

Accordingly, the primary object of the invention is to provide an improved leak tolerant cooling system is which the above described deficiencies are eliminated.

BRIEF SUMMARY OF THE INVENTION

In accordance with the present invention, a leak tolerant liquid cooling system for electrical components comprises a cooling circuit which contains a pump and conduits that circulate a liquid coolant past the electrical components and through the bottom chamber of a purge tank. This purge tank also has a top chamber which is connected to the bottom chamber through a passageway; and, the bottom chamber is sized such that the liquid coolant passes through it with a velocity which is low enough to let any air bubbles in the coolant rise and move by buoyancy through the passageway into the top chamber. Also, the top chamber has an input port and an output port with respective valves, and air is purged from the top chamber through the output port by forcing liquid coolant in through the input port. As this occurs, the coolant continues to be pumped past the electrical components through the coolant circuit. Thus, the pressures throughout the cooling circuit remains constant, and the supply voltages to the electrical components remain constant. Also, to purge air from the top chamber quickly, the passageway between the purge tank chambers is constricted in a way which hinders the flow of coolant from the top chamber to the bottom chamber while the coolant is being forced into the top chamber.

BRIEF DESCRIPTION OF THE DRAWINGS

Various features and advantages of the invention are described herein in conjunction with the accompanying drawings wherein.

DETAILED DESCRIPTION OF THE INVENTION

Figure 1:
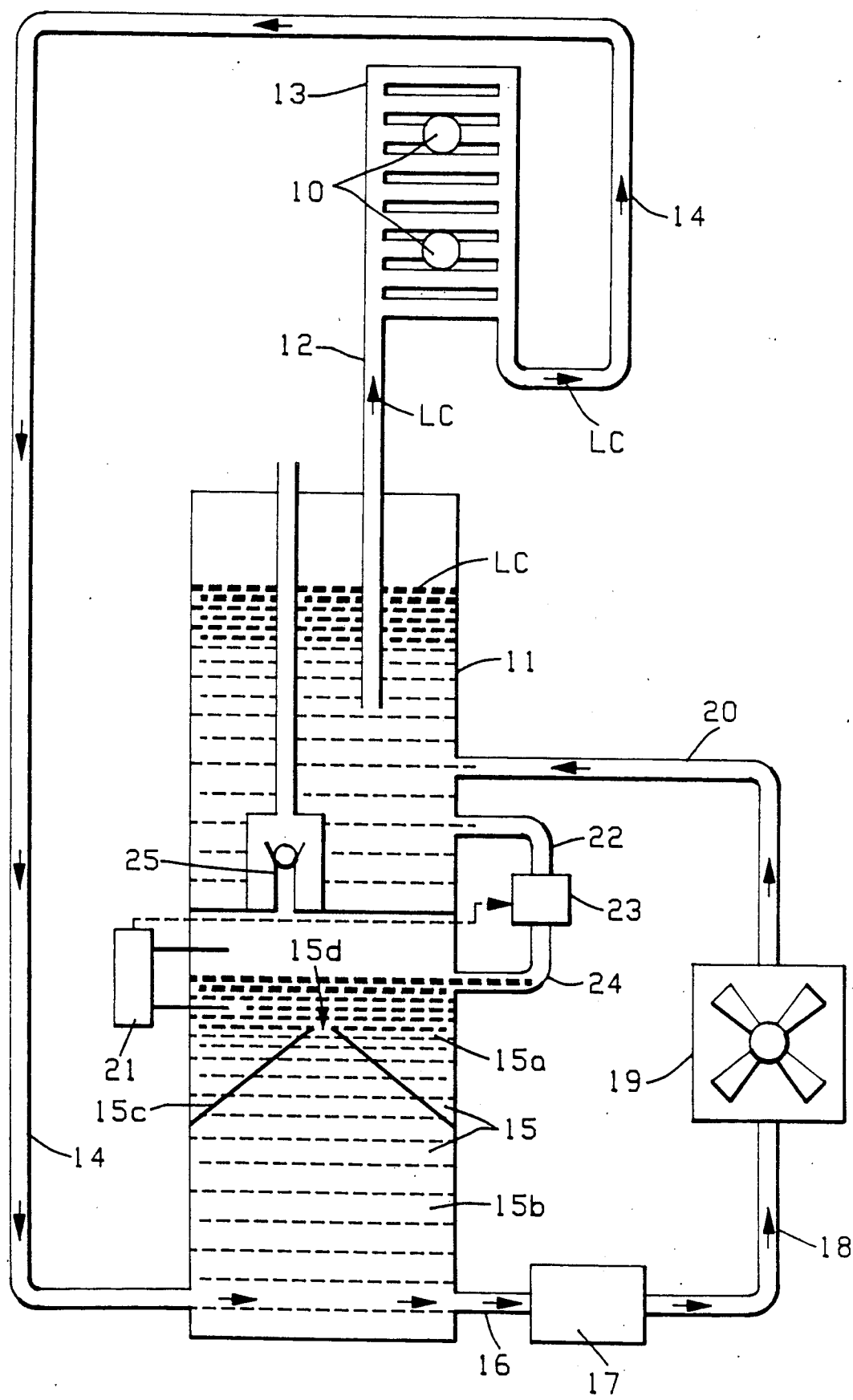
FIG. 1 illustrates in detail the structure of a preferred embodiment of the invention.

Referring now to FIG. 1, a preferred embodiment of a liquid cooling system that is constructed according to the invention will be described. In FIG. 1, the electrical components which the cooling system cools are indicated by referenced numeral 10. They can be any heat generating electrical component, such as high power lamp or transistor. To cool these components, a liquid coolant LC is circulated past them via a circuit which is comprised of components 11-20.

Component 11 is a reservoir which holds the coolant at atmospheric pressure. Component 12 is a conduit that carries the coolant from the reservoir 11 to a cooling jacket 13 which holds the electrical components 10. Component 14 is a conduit which carries the coolant from the cooling jacket to a purge tank 15. This tank has a top chamber 15a and a bottom chamber 15b. Chamber 15b receives the a liquid coolant from conduit 14, and it sends the coolant through a conduit 16 to the input of a pump 17. Coolant from the output of the pump 17 is sent through a conduit 18, a heat exchanger 19, and a conduit 20 back to the reservoir 12.

In the purge tank 15, a dividing member 15c separates the chambers 15a and 15b. However, member 15c has a passageway 15d which enables any air bubbles that are entrained in the coolant to pass from the bottom chamber 15b to the top chamber 15a by buoyancy. To direct the air bubbles to the passageway, the dividing member 15c is tapered upward toward the passageway.

Also included in the top chamber 15a is a sensor 21 which detects when a certain volume of air has accumulated in the top chamber. When that occurs, the accumulated air is purged from the top chamber 15a via some additional components 22-25. Component 22 is a conduit; component 23 is an electro-mechanical control valve which opens in response to a control signal from the sensor 21; component 24 is a conduit to an input port of the chamber 15a; and component 25 is a one-way valve on an output port of the top chamber 15a which opens to the atmosphere.

Figure 2A:
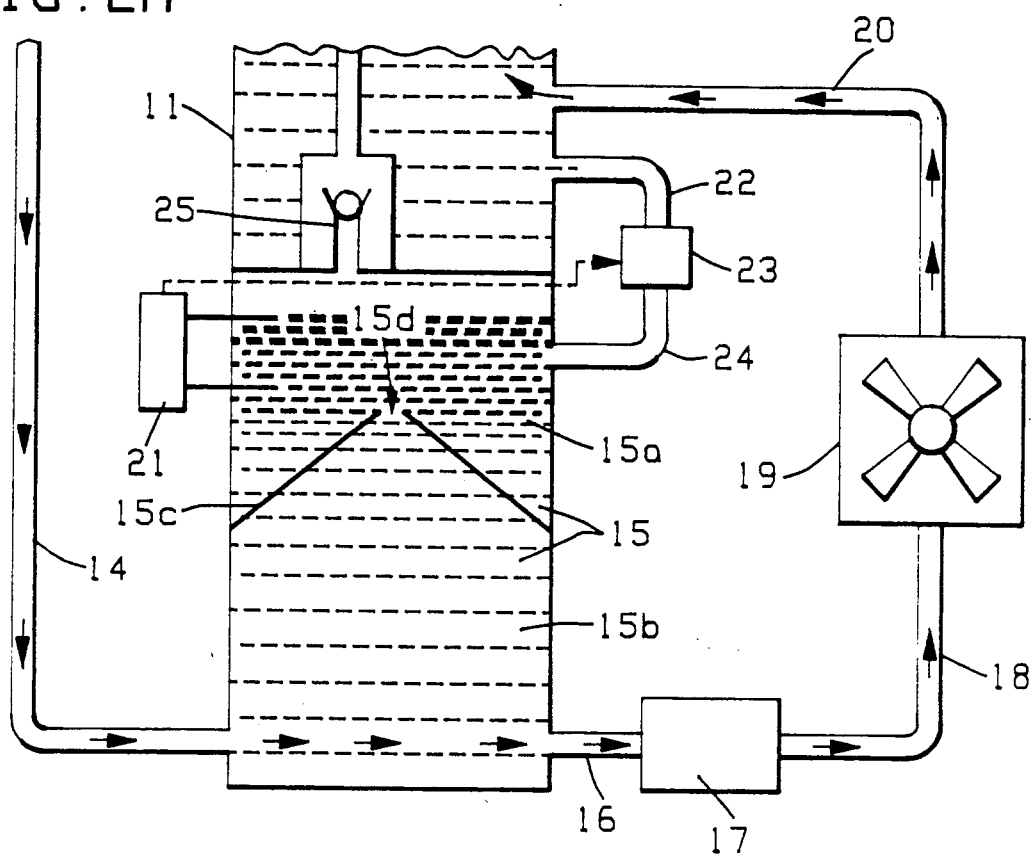
FIGS. 2A-2D illustrate how the FIG. 1 embodiment operates to purge air from the liquid coolant; and, FIGS. 3A-3B illustrate the structure and operation of a modified version of the FIG. 1 embodiment.

Considering now FIGS. 2A-2D, they show all of the details of how the above described system components interact. In FIG. 2A, no air bubbles are entrained in the liquid coolant. Thus, as the coolant passes through the bottom chamber 15b of the purge tank; no bubbles rise through the passageway 15d; and, the amount of air in the top chamber 15a remains fixed.

Suppose next that a leak develops in one of the components 12-14. When that occurs, air is sucked into the leaking component because the coolant in the components 12-14 is below atmospheric pressure. Coolant in the reservoir 11 is at atmospheric pressure, and pressure drops from that reference point occur in the components 12-14 as the coolant is sucked through them by the pump 17. Consequently, no coolant is spilled from the components 12-14 when a leak develops.

Figure 2B:
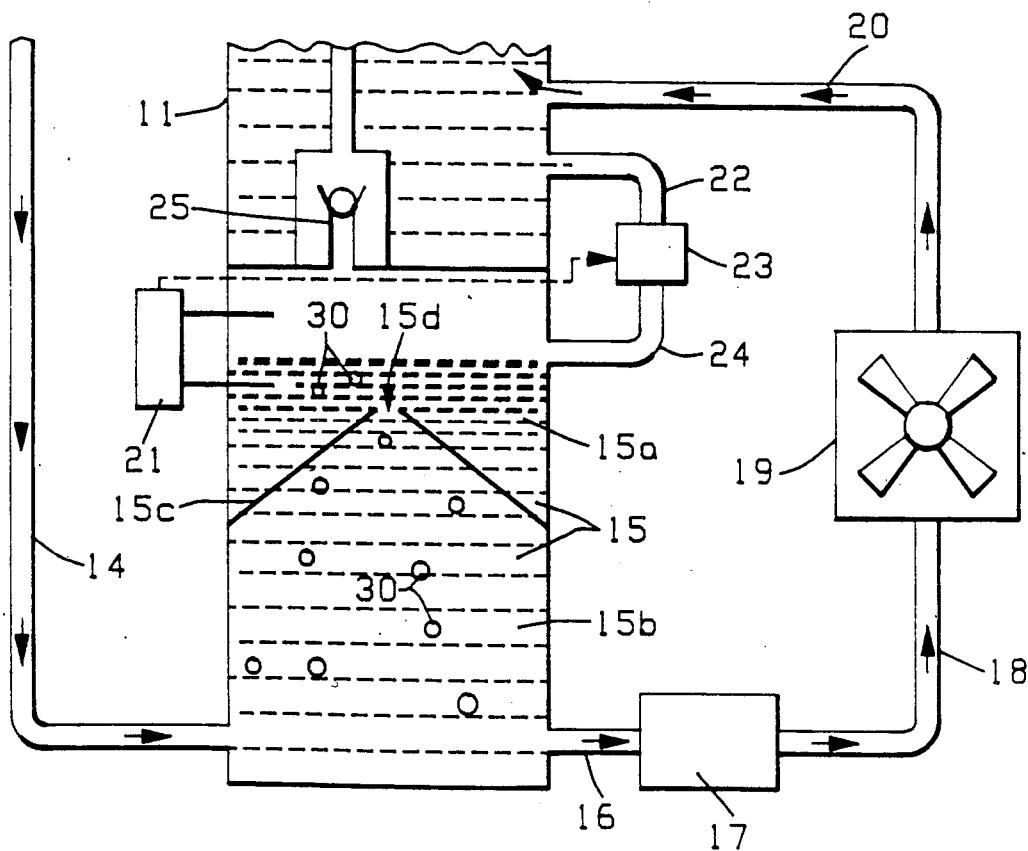
Figure 2C:
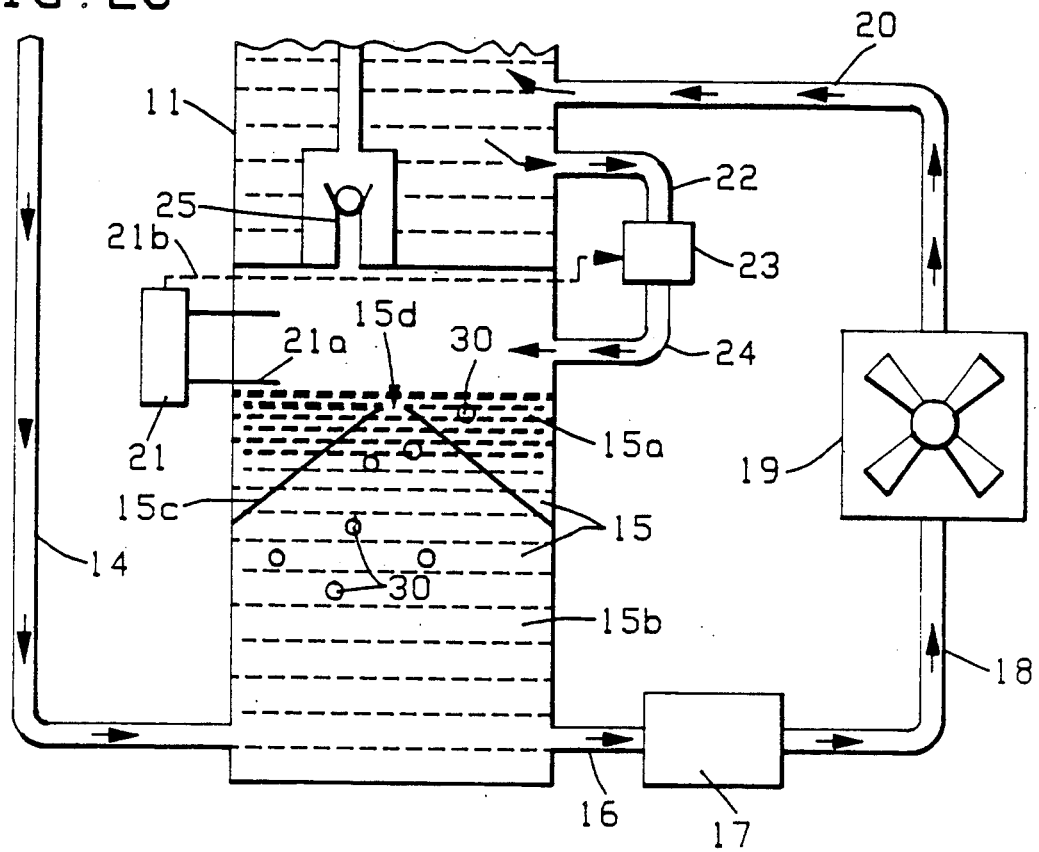

As the coolant with its entrained air passes through the purge tank bottom chamber 15b, the velocity of the coolant slows down. This bottom chamber 15b is sized so that the coolant passes through it with a velocity which is low enough to let any air bubbles that are entrained in the coolant to rise and move by buoyancy through the passageway 15d. These air bubbles and their movement through the passageway is indicated in FIG. 2B by reference numeral 30.

As an air bubble in the purge tank enters the top chamber 15a, the pressure in that chamber rises slightly over the pressure in the bottom chamber 15b. Due to this pressure difference, a small amount of the liquid coolant in the top chamber 15a is forced through the passageway 15d into the bottom chamber. This flow of liquid re-equalizes the pressure in the two chambers 15a and 15b.

If the leak in components 12-14 continues, then the level of the liquid coolant in the top chamber 15a will eventually drop to a certain level which is detected by a probe 21a on the sensor 21. When that occurs, the sensor sends a control signal on a conductor 21b to the valve 23 which causes the valve to open. This is indicated as occurring in FIG. 2C.

Figure 2D:
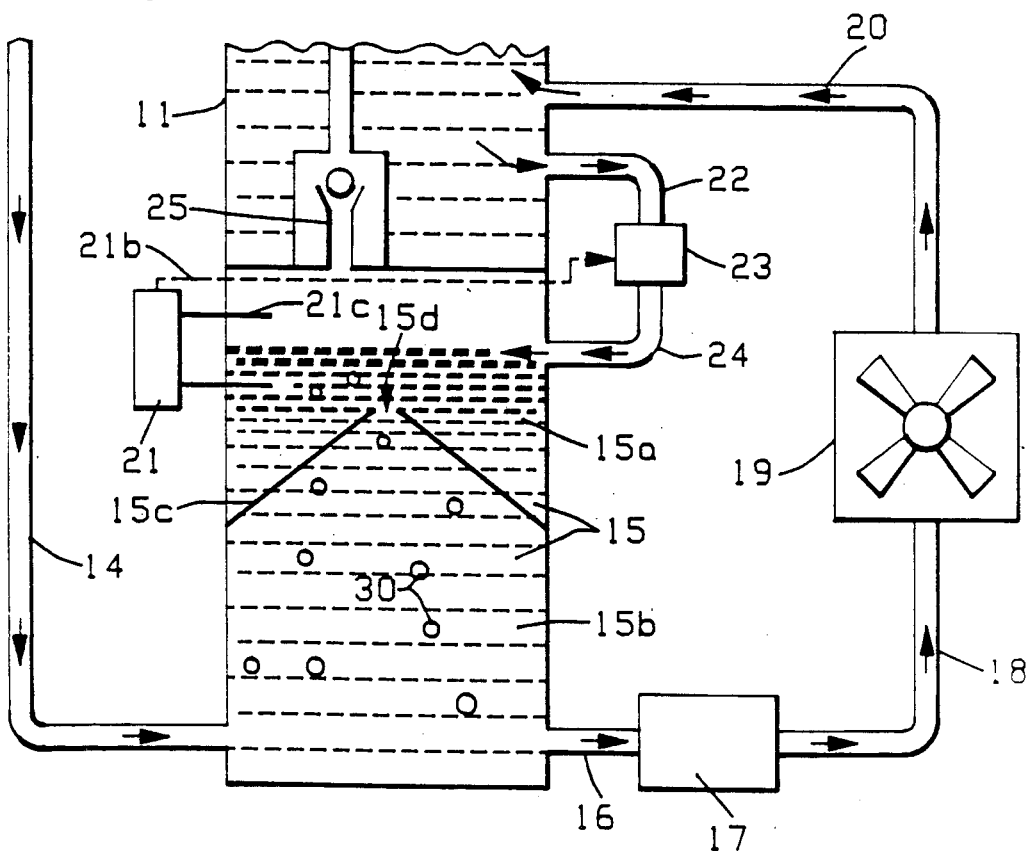

When the valve 23 is open, the liquid coolant passes from the reservoir 11 through the valve 23 into the top chamber 15a. This causes the pressure in the top chamber 15a to rise. When the pressure in the top chamber 15a reaches atmospheric pressure, the one-way valve 25 opens and air escapes from the top chamber 15a to the atmosphere. This is illustrated in FIG. 2D. When the sensor 21 detects via a probe 21c that the liquid coolant in the top chamber 15a has returned to a pre-determined high level, valve 23 is closed.

In order for the level of liquid coolant to rise in the top chamber 15a when valve 23 is open, it is necessary for the flow rate of the coolant through valve 23 to be greater than the flow rate of the coolant through passageway 15d. This constraint is met by making passageway 15d substantially smaller in size than valve 23.

At the same time however, passageway 15d must be kept large enough such that the buoyancy force on an air bubble which passes through the passageway exceeds the surface tension which the passageway exerts on the air bubbles. If passageway 15d is circular, then the surface tension on the air bubble can be expressed as $F_s = 2\pi r\delta$, and the buoyancy force of the air bubble can be expressed as $F_d = (4/3)\rho g \pi r^3$. In these equations, r is the radius of the passageway 15d, $\rho$ is the density of the liquid coolant, and $\delta$ is the surface tension per unit length of the liquid coolant. If the coolant is water, $\delta$ equals 0.0726 Newtons/meter and $\rho$ equals 998 kg/m³. Substituting these values into the above equations for $F_d$ and $F_s$ yields the constraint that r must be greater than 0.131 inches.

A primary feature of the above described cooling system is that throughout the air bubble removing operation of FIGS. 2A-2D, the coolant moves through the circuit components 11-20 with an essentially steady velocity and pressure. Thus, the electrical components 10 are cooled at a constant predetermined rate. In addition, the absence of any pressure transients reduce stress in the components 11-20. Further, since the pump 17 is not switched off and on, power surges or voltage transients from the supply (not shown) which powers the pump 17 and electrical components 10 are avoided.

Figure 3A:
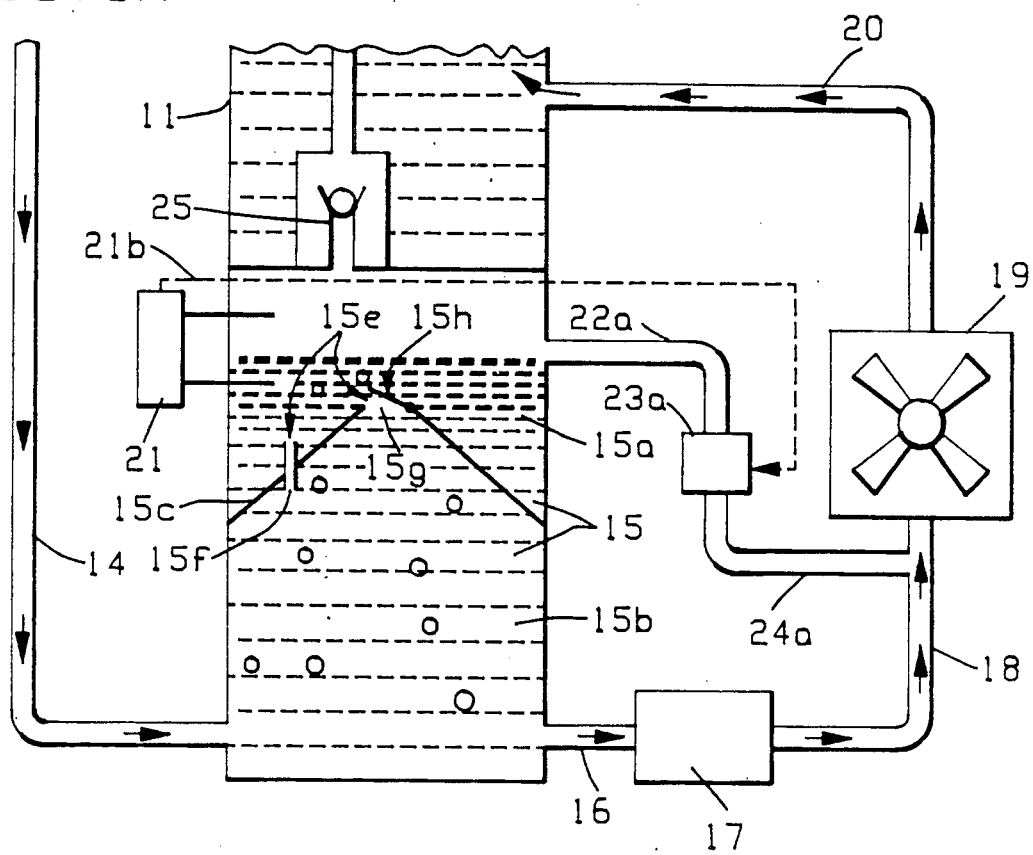
Figure 3B:
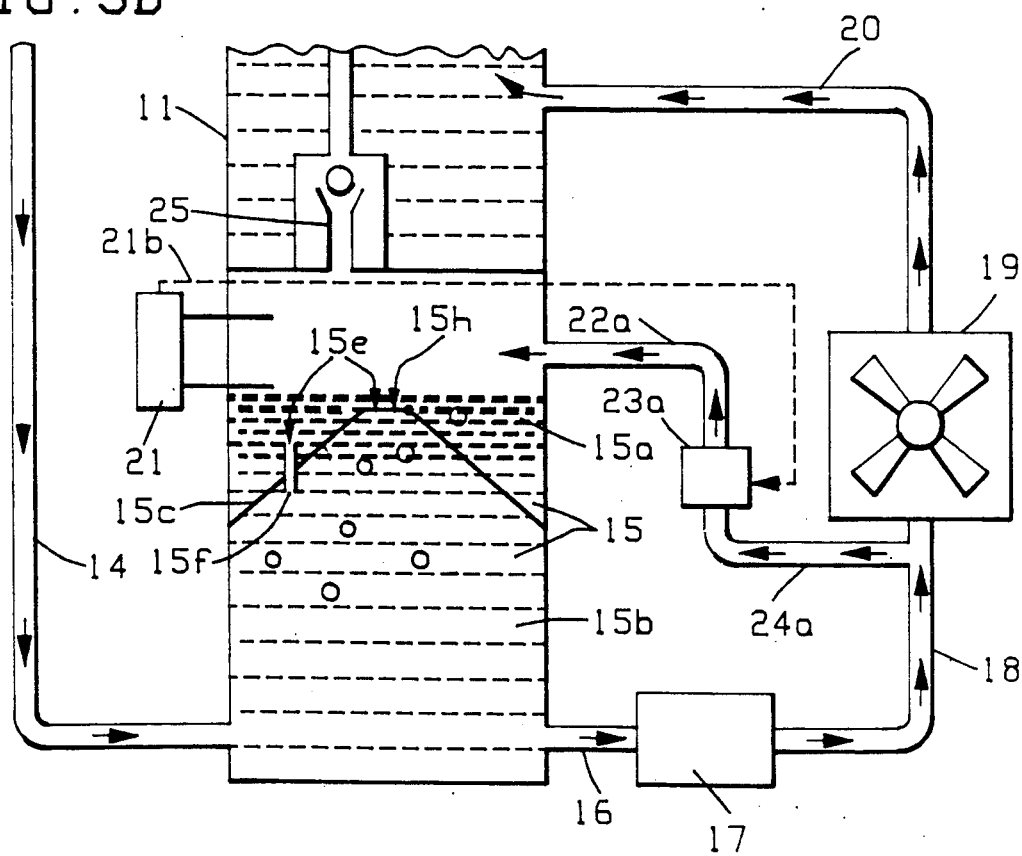

Turning now to FIGS. 3A and 3B, they illustrate the structure and operation of another embodiment of the invention which incorporates two modifications to the previously described embodiment. One of these modifications is that the passageway 15d is replaced with a different passageway 15e. Passageway 15e consists of a small opening 15f that is valve free, and a large opening 15g which is constricted by a one-way valve 15h that opens into the top chamber of the purge tank. The second modification is that the components 22, 23, and 24 are replaced with components 22a, 23a, and 24a which pass the liquid coolant from the positive pressure output port of pump 17 to the input port of the purge tank top chamber 15a. All other components remain unchanged from the previous described embodiment.

In operation, when the air bubbles 30 rise in the bottom chamber 15b, they open the one-way valve 15h and pass through the large opening 15g. Simultaneously, liquid coolant passes from the top chamber 15a to the bottom chamber 15b through the small opening 15f to thereby equalize the pressure between the two chambers. This is illustrated in FIG. 3a.

Subsequently, when the liquid coolant is pumped into the top chamber 15a in order to remove the air from that chamber, the valve 15h closes. This is illustrated in FIG. 3B. As a result, the liquid coolant enters the top chamber via the components 22a-24a much more quickly than it leaves via the small opening 15f; and so, the coolant in the top chamber rapidly rises. Thereafter, valve 23a closes, and coolant passes from the top chamber 15a to the bottom chamber 15b through the small opening 15f until the pressure in those two chambers equalizes. When that occurs, any air bubbles in the bottom chamber 15b can again rise and pass through the one-way valve 15h into the top chamber.

Various preferred embodiments of the invention have now been described in detail. In addition however, many changes and modifications can be made to these embodiments without departing from the nature and spirit of the invention.

For example, from the above description of the embodiment of FIGS. 3A and 3B, it can be seen that the valve 15h together with the small opening 15f essentially operates as a single valve which leaks. Consequently, as another modification, the opening 15f can be eliminated and the valve 15h can be replaced with a leaky valve or a valve which does not close completely.

Accordingly, it is to be understood that the invention is not limited to the described preferred embodiments but is defined by the appended claims.

What is claimed is:

1. A system for cooling electrical components, comprising:

a purge tank having a top chamber and a bottom chamber which are interconnected through a passageway;

a cooling circuit, including a pump and conduits, which circulates a liquid coolant past said electrical components and through said bottom chamber;

said bottom chamber being sized such that said coolant passes through it with a velocity which is low enough to let any air bubbles in said coolant rise and move by buoyancy through said passageway into said top chamber;

said top chamber having an input port and an output port;

control means which removes air from said top chamber through said output port by forcing said coolant in through said input port at a high rate while simultaneously pumping said coolant through said cooling circuit; and, said passageway being adapted to limit any flow of said coolant from said top chamber to said bottom chamber to a low rate while said coolant is being forced into said to chamber.

2. A system according to claim 1 wherein said passageway consists of a single opening which is valve free and which is of a size that limits the flow of said coolant to said low rate.

3. A system according to claim 1 wherein said passageway consists of two openings, one of which is valve free and the other of which is constricted by a one-way valve which opens into said top chamber.

4. A system according to claim 1 wherein said passageway consists of a single opening which is constricted by a one-way valve which opens into said top chamber and which does not fully close.

5. A system according to claim 1 wherein said cooling circuit includes a reservoir which holds a supply of said coolant at atmospheric pressure, an input on said pump which sucks said coolant from said reservoir past said electrical components and through said bottom chamber at negative pressure, and an output on said pump which returns said coolant to said reservoir at positive pressure.

6. A system according to claim 5 wherein said passageway consists of one opening which is valve free and another opening which is constricted by a one-way valve which opens into said top chamber.

7. A system according to claim 6 wherein said bottom chamber tapers in an upward direction toward said top chamber and directs said bubbles to said passageway.

8. A system according to claim 7 wherein said circuit includes a reservoir for said liquid, and wherein said reservoir and said purge tank are integrated into a single enclosed unit in which one dividing member separates said reservoir from said top chamber and another dividing member separates said top chamber from said bottom chamber.

9. A system according to claim 8 wherein said control means includes a sensor for generating a control signal indicating when a certain volume of air has accumulated in said top chamber, a pipe from said reservoir to said input port, and a valve in said pipe which opens in response to said control signal.

10. A system according to claim 1 wherein said control means includes a sensor for generating a control signal indicating when a certain volume of air has accumulated in said top chamber, a reservoir of said coolant at atmospheric pressure, a pipe from said reservoir to said input port, and a valve in said pipe which opens in response to said control signal.

11. A system according to claim 1 wherein said control means includes a sensor for generating a control signal indicating when a certain volume of air has accumulated in said top chamber, a pipe from a positive pressure output on said pump to said input port, and a valve in said pipe which opens in response to said control signal.

12. A system according to claim 1 wherein said bottom chamber tapers in an upward direction toward said top chamber and directs said bubbles to said passageway.

13. A system according to claim 1 wherein said purge tank and a reservoir for said coolant are integrated into a single enclosed unit in which one dividing member separates said reservoir from said top chamber and another dividing member separates said top chamber from said bottom chamber.

* * * * *